United States Patent [19]

Klayman

[11] Patent Number: 5,463,389
[45] Date of Patent: Oct. 31, 1995

[54] DATA COMPRESSION METHOD AND DEVICE UTILIZING CHILDREN ARRAYS

[75] Inventor: Jeffrey T. Klayman, Canton, Mass.

[73] Assignee: Motorola, Inc., Schaumburg, Ill.

[21] Appl. No.: 125,904

[22] Filed: Sep. 24, 1993

[51] Int. Cl.$^6$ .................................................. H03M 7/30
[52] U.S. Cl. ............................................ 341/51; 341/106
[58] Field of Search ................................ 341/51, 67, 95, 341/106

[56] References Cited

U.S. PATENT DOCUMENTS

| | | | |
|---|---|---|---|
| 4,558,302 | 12/1985 | Welch | 341/51 |
| 4,612,532 | 9/1986 | Bacon et al. | 341/51 |
| 4,814,746 | 3/1989 | Miller et al. | 341/95 |
| 5,087,913 | 2/1992 | Eastman | 341/95 |
| 5,150,119 | 9/1992 | Yoshida et al. | 341/51 |
| 5,153,591 | 10/1992 | Clark | 341/51 |

OTHER PUBLICATIONS

"Data Compression Procedures for DCEs Using Error Correcting Procedures", International Telegraph and Telephone Consultative Committee, 29 Sep. 1989 Study Group XVII.

Text Compression/Timothy C. Bell, John G. Cleary, Ian H. Witten, Library of Congress Cataloging–in–Publication Data, Computer Science, pp. 238–240, 1990.

Data Compression, Library of Congress Cataloging–in–Publication Data, Computer Science Press, pp. 14–15, 1988.

Primary Examiner—Marc S. Hoff
Attorney, Agent, or Firm—Darleen J. Stockley

[57] ABSTRACT

A method (700) and device (1100) increase throughput of a data compression encoder or decoder by using children arrays instead of linked lists in the building and maintenance of the tree. A children array with elements corresponding to each of the input symbols is allocated to a node. An input character is used as an index into the children array. The search result is determined by the value in the children array. Where a search is successful, the value in the children array is a pointer to the child node. A node is added by storing a pointer to the node in the parent's children array at the location indexed by the input character and is deleted by storing a NULL value in the parent's children array where the child node had been. The search, add, and delete operations become very efficient, and each operation has a constant execution time.

64 Claims, 7 Drawing Sheets

PRIOR ART

DATA COMPRESSION METHOD AND DEVICE UTILIZING CHILDREN ARRAYS

FIELD OF THE INVENTION

The present invention relates generally to data compression, and more particularly to data compression using children arrays.

BACKGROUND

Data communication is the movement of computerencoded information from one point to another by means of a transmission system. Data communication results in nearly instantaneous information exchange over long distances.

Data communication links data terminal equipment (DTE) such as a terminal, printer or computer that transmits or receives data. Data communication equipment (DCE) is a device attached between a DTE and the communication channel that manipulates the transmitted signal or data. The DCE usually comprises a microprocessor and random access memory (RAM). The communication channel is often a telephone network, although it could be a cellular network, a digital communication network, or a satellite network.

The information sent by a transmitter DTE (TXDTE) to a receiver DTE (RXDTE) consists of a sequence of characters. The information generally contains a significant amount of redundancy. The information, therefore, may be compressed so that it can be transmitted in less time over a communication channel.

Among known data compression methods is the Ziv-Lempel '78 algorithm ("ZL78"). In the ZL78 algorithm, the transmit DCE (TXDCE) records the history of recently transmitted data by storing the strings in a vocabulary (also referred to as the "vocabulary tree") stored in the TXDCE RAM. By comparing successive elements of the current data with the vocabulary, redundant data is found. The TXDCE, instead of sending the entire redundant sequence, sends a codeword which points to the location of the earlier occurrence of the redundant data in the vocabulary tree. Data compression occurs whenever the number of bits required to send the codeword is less than the number of bits in the redundant data sequence.

At the other end of the channel, the receiver DCE (RXDCE) maintains a vocabulary in the RXDCE RAM similar to that maintained by the TXDCE. Upon receipt of the codeword from the TXDCE, the RXDCE uses the codeword to find the redundant data sequence in the vocabulary. The RXDCE then transmits the data sequence to the TXDTE.

As the information is transmitted, the TXDCE builds a vocabulary according to a set of rules. The vocabulary is a tree structure data base with various levels of interconnected nodes. A full description of a procedure for building the tree, updating the tree, deleting nodes from the tree and adding nodes to the tree may be found in Clark, U.S. Pat. No. 5,153,591 and Welsh, U.S. Pat. No. 4,558,302. Such a tree structure has been implemented in V.42bis applications for the CCITT (Comite Consultatif International de Telegraphie et Telephonie).

In a typical implementation, each node in the vocabulary tree contains down, left, and right pointers. The down pointer of a node points to a linked list of children nodes The left and right pointers are used to link the node to other children nodes under a common parent node. Searching in the vocabulary tree involves moving down the tree and traversing across the linked list of children nodes. Thus, the search operation involves a sequential search of a linked list, which is expensive in terms of microprocessor usage. Adding and deleting from the vocabulary tree involves updating the left and right pointers of adjacent nodes in the linked list, and may involve updating the down pointer of the parent node. Thus, the add and delete operations are expensive in terms of microprocessor usage.

These methods for encoding and decoding compressed data therefore require significant amounts of microprocessor usage. Thus, there is a need for a method and device using less microprocessor usage.

DETAILED DESCRIPTION OF A PREFERRED EMBODIMENT

The present invention increases data compression throughput by allowing for very fast search, add, and delete operations. Thus, the use of a children array at each node in the vocabulary is much different than using an array to get to a root node.

A children array is an array allocated to a node wherein a number of elements in each children array corresponds to a size of an alphabet of uncompressed characters. The preferred embodiment applies to common 8-bit data characters and so uses 256 root nodes and 256 elements per children array. Each element in a children array corresponds to one of the characters of the alphabet. In the preferred embodiment, the 8-bit value representing the character acts as the character offset in the children array.

Other nodes described herein are defined as follows: A tree is a structure that represents a set of strings with a same initial character. A leaf node is a point on a tree which represents a last character in a string (i.e., a node that has no children). A parent node is a point on a tree which represents that, for a next set of operations, represents a string that has already been matched. The terms "vocabulary" and "dictionary" are used interchangeably.

To search for a character as a child of a parent node, the parent's children array is indexed by the character. The value stored at the indexed memory location determines whether or not the character is a child of the parent. In the preferred embodiment, a non-zero value indicates that the character is a child of the parent, and a zero value indicated that the character is not a child of the parent. In the preferred embodiment, the non-zero elements of each children array also act as down pointers to children nodes. Thus, a null value is a predetermined value that cannot be mistaken for a pointer value. To add a character to a parent node, a pointer to the new child node is stored in the parent's children array at the location indexed by the character. To delete a character from a parent node, for example, where a leaf node is recovered from the vocabulary during normal tree maintenance, a zero is stored in the parent's array at the location occupied by the child.

Alternatively, a flag may be utilized wherein the flag (child_exists) indicates that existence of a child. For example, a flag may be selected to be a single bit for each element in the absence of down pointers in a parent's children array, location of a child node that is known to exist (e.g., due to a flag) requires either hashing or content-addressable memory (CAM) techniques, as is known in the art. Such techniques are either extremely time-consuming or expensive relative to the present invention.

The V.42bis, as well as other selected data compression algorithms, require that leaf nodes be recovered (deleted) during the normal maintenance of the vocabulary. Prior art, when utilizing a linked list, defined a leaf node as a node whose down pointer was null. Utilizing the present invention, when a children array is used, a leaf node is one whose children array has all elements zero. Since utilizing a processor to check all elements of the array to determine whether a node is a leaf node is very processor intensive, in the preferred embodiment, a child counter is maintained in each node. The child counter shows the number of children in the node's children array. When a child is added, the parent's child counter is incremented; when a child is deleted, the parent's child counter is decremented. When the child counter indicates zero, the node is a leaf node.

In order to delete a child node from a parent node, the child's position in the parent's children array is cleared, and the parent's child counter is decremented. In order to facilitate access to those fields stored in the parent node, two "up" pointers, i.e., pointers into the parent node, are stored in the child node, one pointing to the node's position in its parent's children array, and another pointing to the parent's child counter. The up pointer into the parent's children array is used to provide faster access than other alternatives such as storing the character in the child node, using a single up pointer in the parent node, and indexing into the parent's children array.

Figure 1:
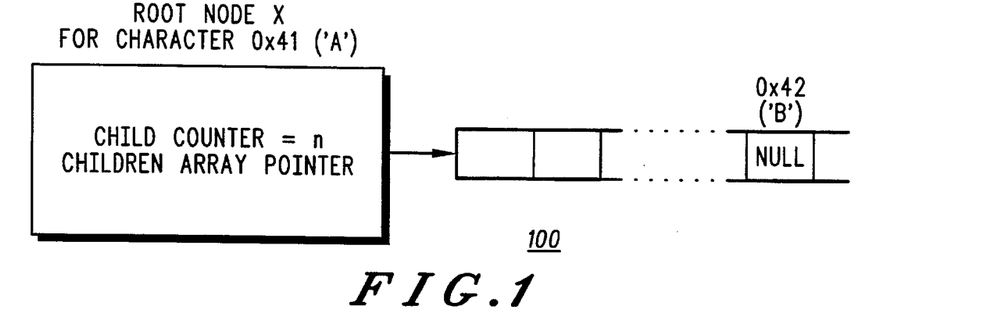
FIG. 1 illustrates a pointer arrangement for an exemplary string 'A'.
Figure 2:
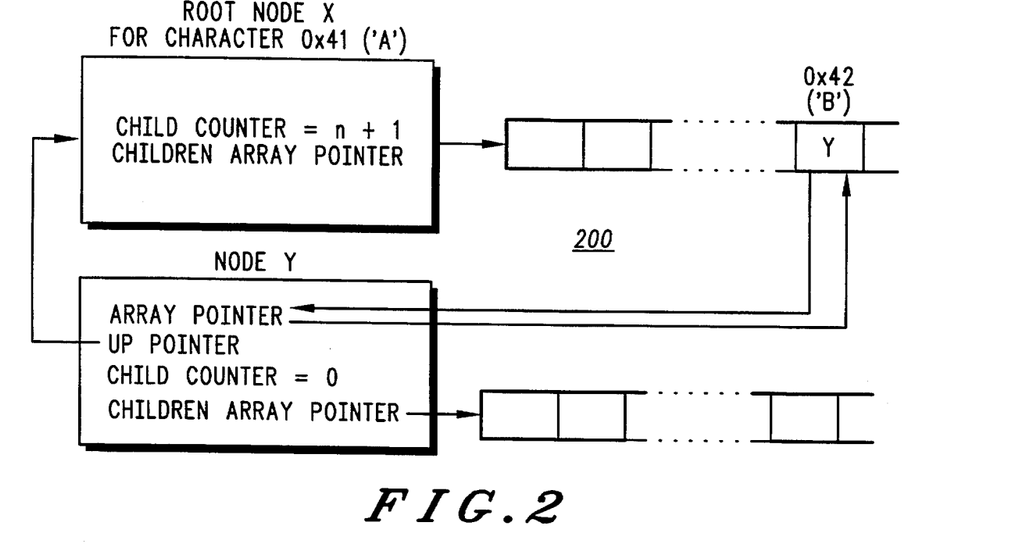
FIG. 2 illustrates a pointer arrangement for an exemplary implementation of the method of the present invention to string 'A' of FIG. 1 to provide string 'AB'.
Figure 3:
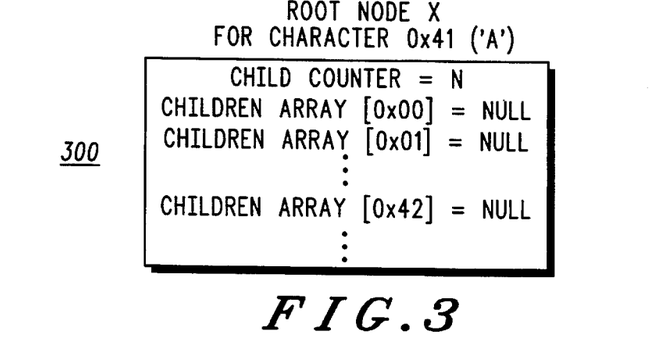
FIG. 3 illustrates an embodiment of array configurations for the exemplary string arrangement of FIG. 1 in which a children's array is incorporated into a node data structure.
Figure 4:
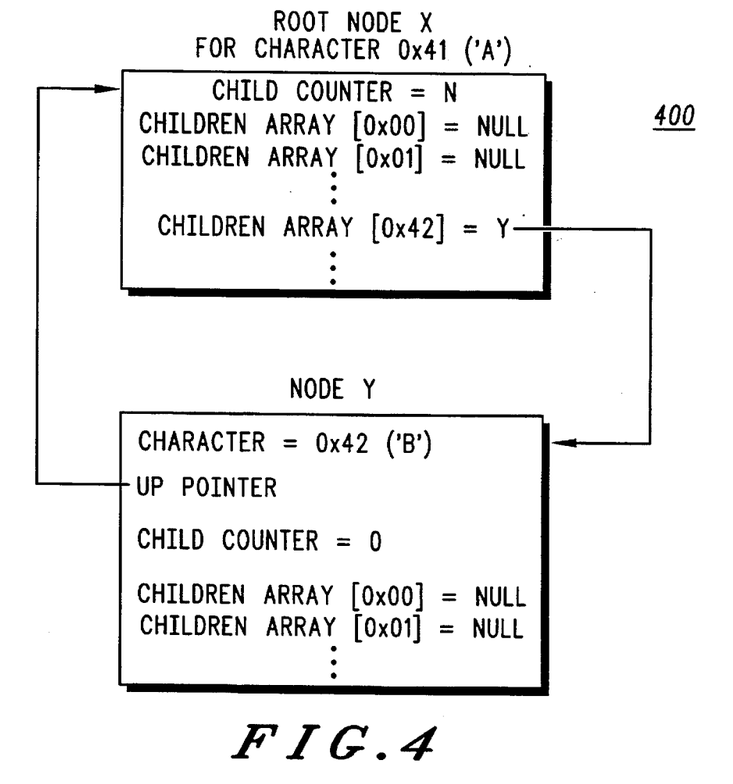
FIG. 4 illustrates an embodiment of array configurations for the exemplary implementation of FIG. 2 in which a children's array is incorporated into a node data structure.

FIG. 1, numeral 100, illustrates a pointer arrangement for an exemplary string 'A'. FIG. 2, numeral 200, illustrates a pointer arrangement for an exemplary implementation of the method of the present invention to string 'A' of FIG. 1 to provide string 'AB'. FIG. 3, numeral 300, illustrates an embodiment of array configurations for the exemplary string arrangement of FIG. 1 in which a children's array is incorporated into a node data structure. FIG. 4, numeral 400, illustrates an embodiment of array configurations for the exemplary implementation of FIG. 2 in which a children's array is incorporated into a node data structure. Where a children array is unassigned for each node, children arrays may be allocated as needed, for example, where a child is being added to a parent that had not previously been allocated a children array. Allocation of children arrays "on the fly" provides fewer arrays than nodes since not every node in a vocabulary has children and may be selected to utilize less memory (since not every node in a vocabulary has children) than allocating a children array to every node. However, allocating children arrays "on the fly" has some detriments. For example, allocation and deallocation of array time is increased. Alternatively, a children array may comprise part of each node data structure.

Throughput performance is increased at the expense of much higher memory requirements. A 2K node vocabulary using children arrays of 256 words each and allocating one children array per node consumes 1M of memory for the children arrays alone.

Figure 5:
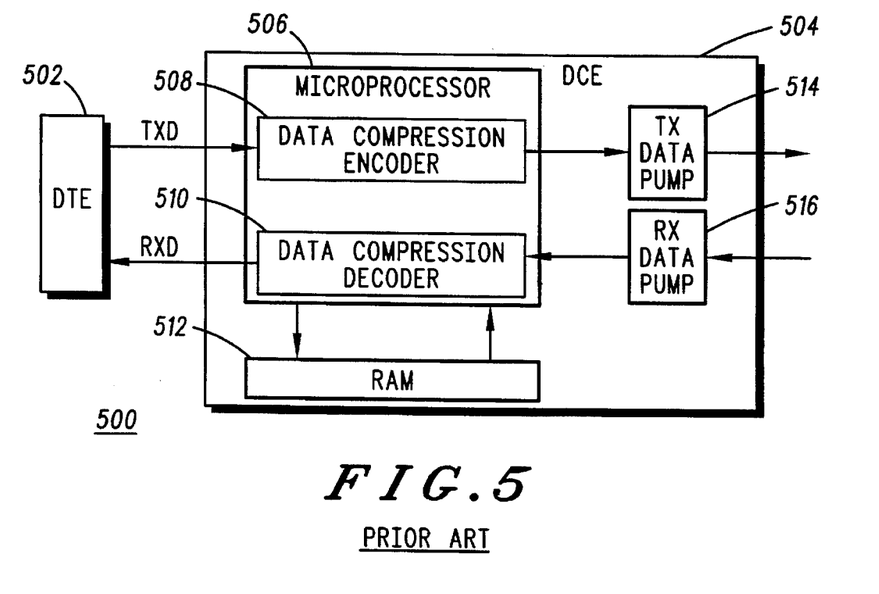
FIG. 5 shows a block diagram of a data communication system as is known in the art.

FIG. 5, numeral 500, shows a block diagram of a data communication system as is known in the art. DTE 502 is coupled to DCE 504. DTE 502 sends information for transmission (TXD) to DCE 504. DCE 504 includes a microprocessor 506. Microprocessor 506 performs the functions of a data compression encoder 508 and a data compression decoder 510. Data compression encoder 508 takes TXD and compresses the TXD into codewords, if possible. Transmit data pump 514 sends the compressed TXD via a communication channel to a DCE/DTE pair at some other location. As is commonly used in data communication, an "RX" prefix indicates "receiver", while a "TX" prefix indicates "transmitter".

Similarly, receive data pump 516 obtains compressed RXD from a communication channel. Data compression decoder 510 then decompresses the compressed RXD into RXD for use by DTE 502.

RAM 512 is coupled to microprocessor 506. RAM 512 contains, among other things, the vocabulary and the program controlling the microprocessor.

Figure 6:
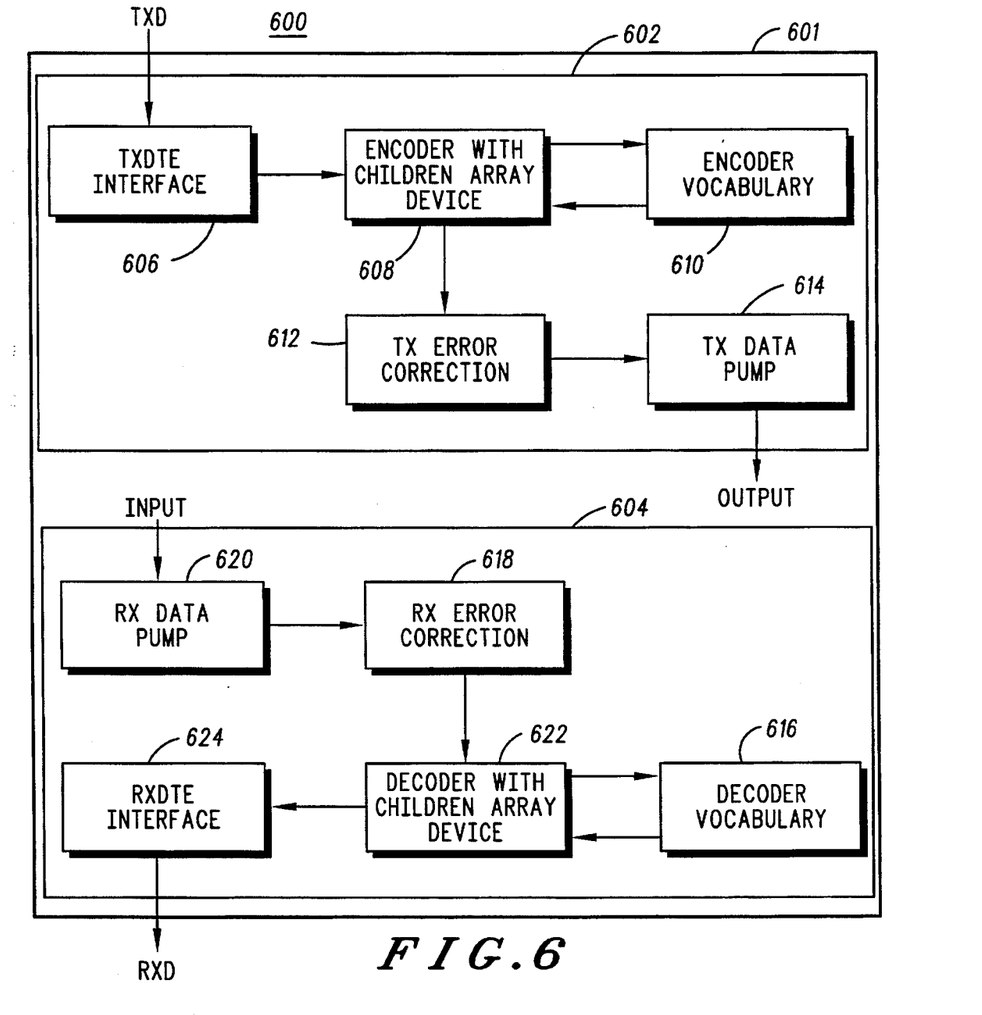
FIG. 6 shows a functional block diagram of a DCE 601 with both transmit and receive modes utilizing the device of the present invention.

FIG. 6, numeral 600, shows a functional block diagram of a DCE 601 with both transmit and receive modes utilizing the device of the present invention (described in more detail below) . Clearly, where selected, the DCE may be operated with the device of the present invention only in transmit or only in receive mode. Also, in this example, but clearly, selectably, the TX data pump 614 and the RX data pump 620 are located within the DCE 601. TXDCE 602 communicates with a remote RXDCE by way of a communication channel. In most cases, a DCE contains both a TXDCE and a RXDCE.

TXDCE 602 receives TXD via the transmit DTE interface (TXDTE) 606. TXD then is transmitted to data compression encoder 608, wherein the encoder utilizes the device of the present invention. Encoder vocabulary 610 is read from and written to by data compression encoder 608.

TX error correction 612 receives data from data compression encoder 608, and sends the data to TX data pump 614 for transmission via a communication channel to a remote RXDCE.

RX data pump 620 receives data from communication channel. RX error correction 618 processes the data, and sends the data to the data compression decoder 622 which utilizes the device of the present invention. The data compression decoder 622 then decodes the codeword by using decoder vocabulary 616, and sends the character string represented by the codeword to the RXDTE interface 624.

Figure 7:
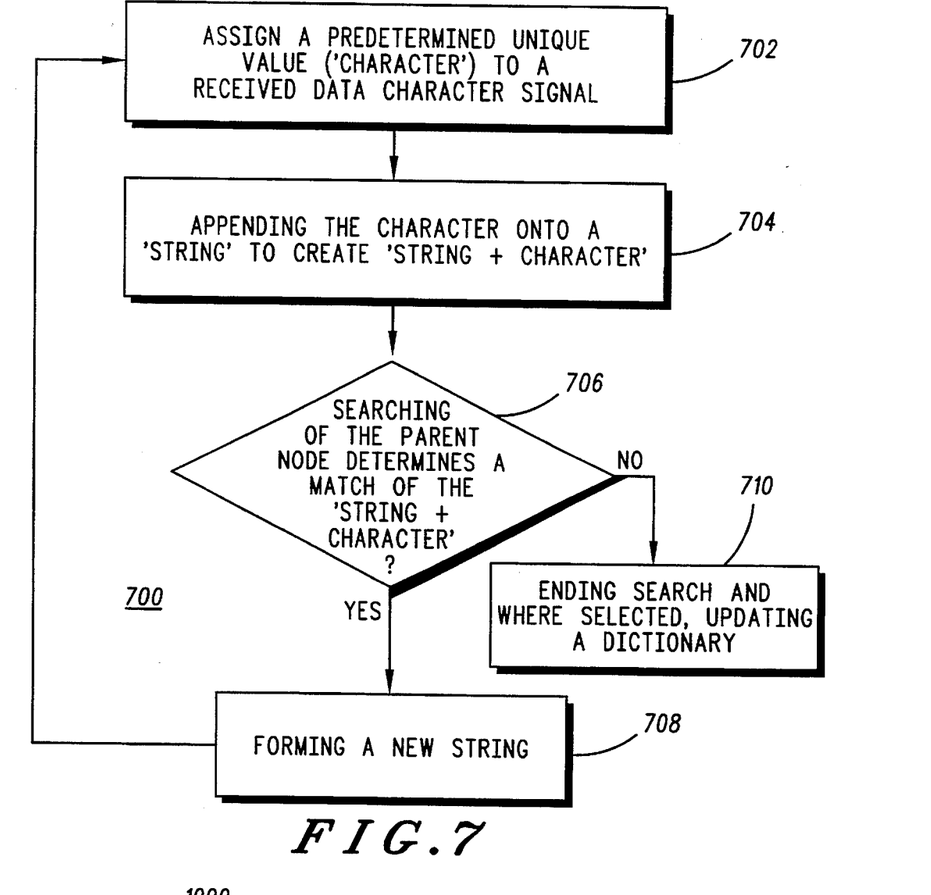
FIG. 7 is a flow chart of one implementation of the method of the present invention.

FIG. 7, numeral 700, is a flow chart of one implementation of the method of the present invention. The method maximizes throughput of data character signals in a data compression encoder/decoder wherein a string, upon being allocated one character, is represented by a parent node that is allocated a children array, comprising the steps of: A) assigning a predetermined unique value (i.e., 'character') to a received data character signal (702), B) appending the 'character' onto a 'string' to create a 'string+character' (704), C) searching the parent node for a match of the 'string+character' by employing a children array indexed by the 'character' (706) and one of D and E: D) where a match is obtained, forming a new 'string' from the 'string+character' and recycling to step A (708), and E) where there is an unsuccessful match, ending the search (710). Typically, the children array has an entry corresponding to each 'character, and the predetermined unique value is an ordinal value.

Searching a node generally includes searching for the 'string+character' in a dictionary and using the predetermined unique value of the 'character' as an offset into the parent node's children array. A value stored in the parent node's children array at the offset indicates one of: a successful match (i.e. 'string+character' is in the dictionary), and an unsuccessful match. Where there is an unsuccessful match, the 'string' represents a longest matched string and the 'character' represents an unmatched character.

Updating may further include updating the dictionary with the 'string+character' following an unsuccessful match.

Figure 8:
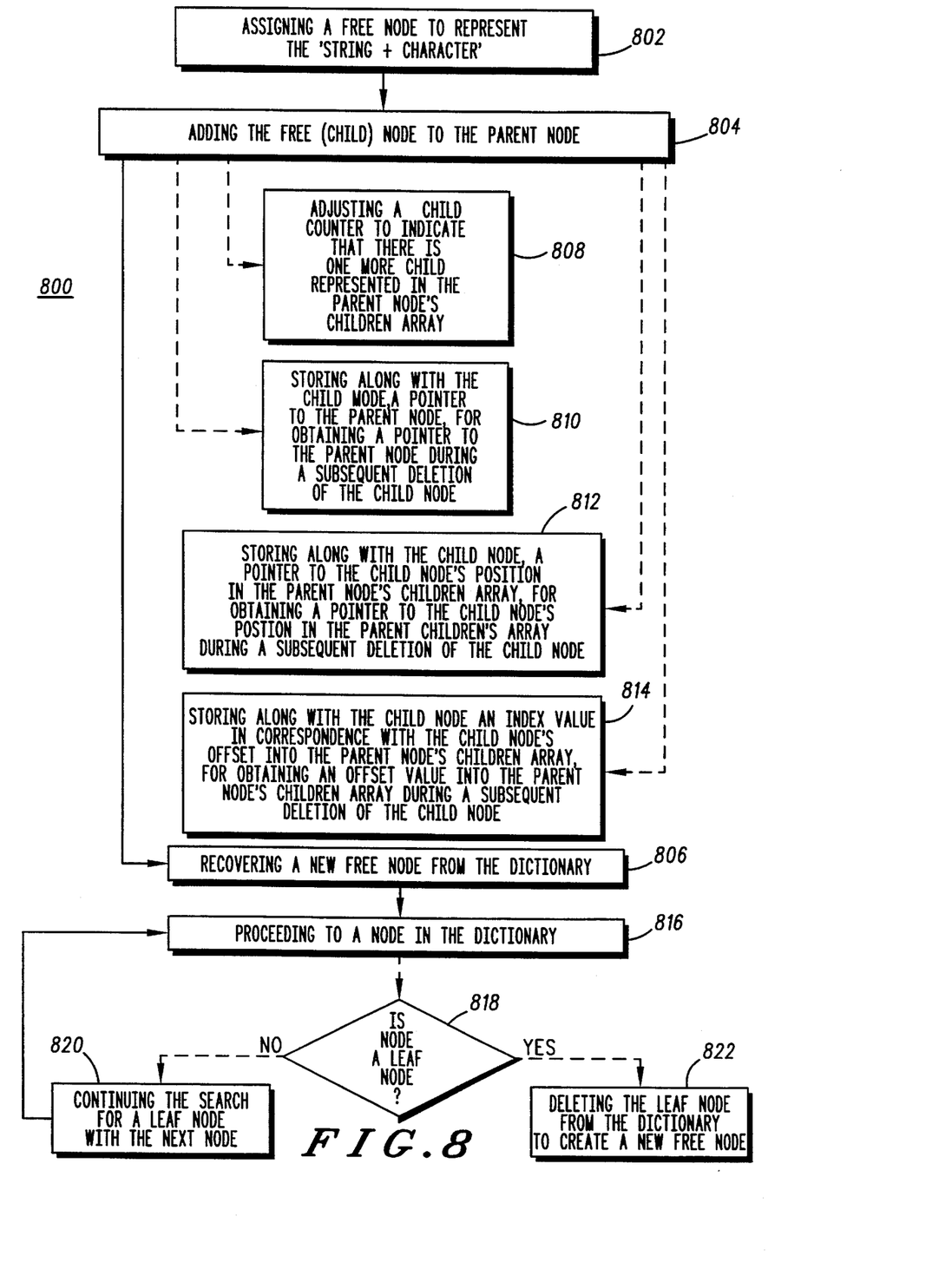
FIG. 8 is a flow chart showing one embodiment of updating the dictionary in accordance with the method of the present invention.

FIG. 8, numeral 800, is a flow chart showing one embodiment of updating the dictionary in accordance with the method of the present invention. Updating the dictionary typically comprises the steps of: assigning a free node to represent the 'string+character' (802), adding the free node (i.e. the child node) to the parent node (804), and recovering a new free node from the dictionary (806).

Adding the child node to the parent node typically includes storing a value in the parent node's children array at the offset into the children array corresponding to the predetermined unique value assigned to the 'character', wherein the value indicates that the 'string+character' is in the dictionary. The value that indicates that the 'string+character' is in the dictionary is also a pointer to the child node.

The method may further include adjusting a child counter to indicate that there is one more child represented in the parent node's children array (808). Also, a step of storing along with the child node, a pointer to the parent node, may be included for obtaining a pointer to the parent node during a subsequent deletion of the child node (810). In addition, a step of storing along with the child node, a pointer to the child node's position in the parent node's children array, may be included for obtaining a pointer to the child node's position in the parent node's children array during a subsequent deletion of the child node (812).

A step of storing along with the child node an index value, such as the input symbol 'character' or the predetermined unique value assigned to the input symbol 'character', in correspondence with the child node's offset into the parent node's children array (814), may be included for obtaining an offset into the parent node's children array during a subsequent deletion of the child node.

Recovering a node from the dictionary typically includes proceeding to a node in the dictionary (816), determining whether the node is a leaf node (818), and of one of: A) where the node is a non-leaf node, continuing the search for a leaf node with the next node (820), and B) where the node is a leaf node, deleting the leaf node from the dictionary to create a new free node (822).

In one embodiment, determining that the node is a leaf node typically includes testing that a child counter associated with the node is set to a value signifying an empty children array in the node. In a second embodiment, determining that the node is a leaf node may include testing that each element in the node's children array is set to a value such that searching for a 'string+character' in the dictionary, where 'string' is the string represented by the node and 'character' is the appended 'character' results in an unsuccessful match.

Deleting the leaf node ('string+character') from the dictionary typically includes storing an unsuccessful match indicator value in the children array of the node that represents 'string' (i.e. the parent node) at the offset into the children array corresponding to the predetermined unique value assigned to the input symbol 'character', such that the value indicates an unsuccessful match in a subsequent search for the 'string+character'.

In one embodiment, storing an unsuccessful match indicator value in the parent node's children array typically includes retrieving a pointer to the leaf node's position in the parent node's children array stored along with the leaf node and writing the value into the parent node's children array at the position addressed by the pointer to the leaf node's position in the parent node's children array.

Figure 9:
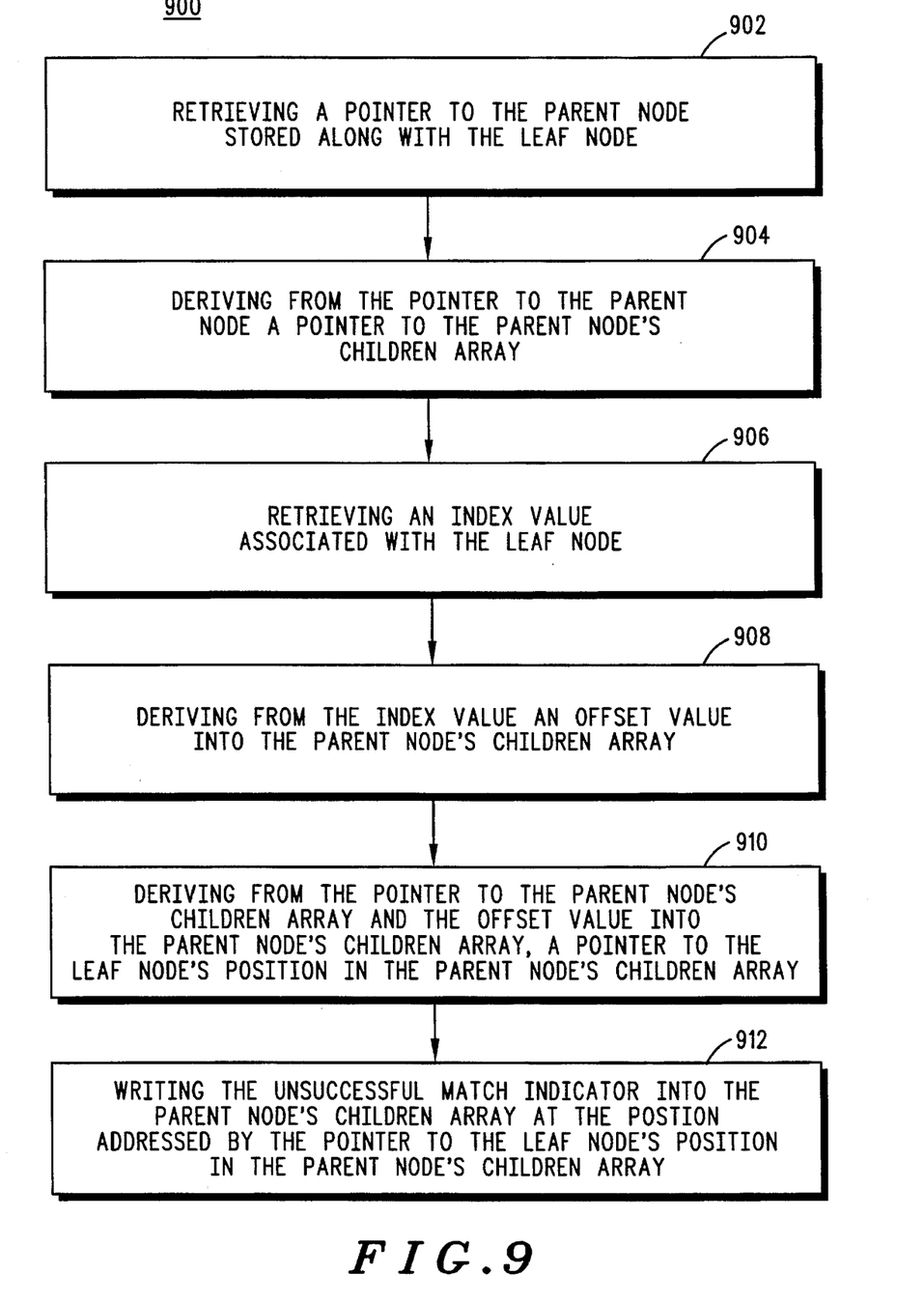
FIG. 9 is a flow chart of an embodiment of steps for storing an unsuccessful match indicator value in the parent node's children array in accordance with the method of the present invention.

In another embodiment, storing an unsuccessful match indicator value in the parent node's children array typically includes the steps of: A) retrieving a pointer to the parent node stored along with the leaf node (902), B) deriving from the pointer to the parent node a pointer to the parent node's children array (904), C) retrieving an index value associated with the leaf node (906), D) deriving from the index value an offset value into the parent node's children array (908), E) deriving from the pointer to the parent node's children array and the offset value into the parent node's children array a pointer to the leaf node's position in the parent node's children array (910), and F) writing the unsuccessful match indicator value into the parent node's children array at the position addressed by the pointer to the leaf node's position in the parent node's children array (912). This embodiment is set forth in a flow chart in FIG. 9, numeral 900.

Figure 10:
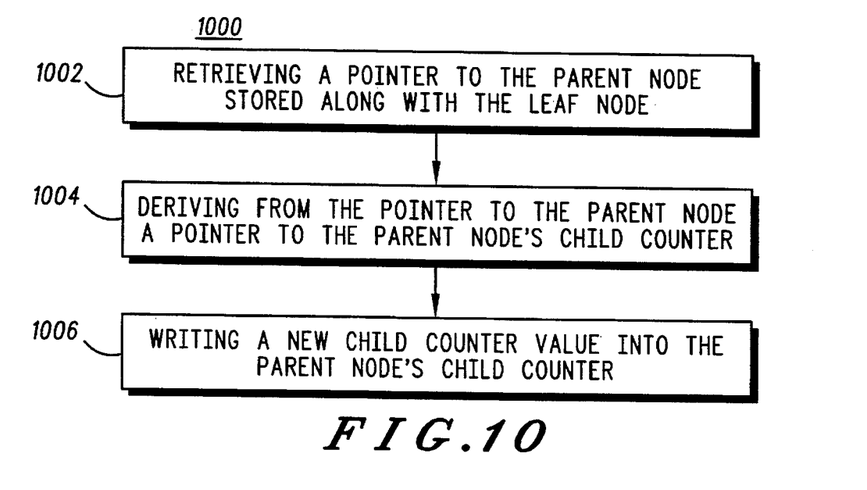
FIG. 10 is a flow chart of an embodiment of adjusting a child counter associated with the parent node to signify that there is one less child represented in the parent node's children array in accordance with the method of the present invention.

The method may further include adjusting a child counter associated with the parent node to signify that there is one less child represented in the parent node's children array, as is set forth in FIG. 10, numeral 1000. Adjusting the child counter associated with the parent node generally includes the steps of: A) retrieving a pointer to the parent node stored along with the leaf node (1002), B) deriving from the pointer to the parent node a pointer to the parent node's child counter (1004), and C) writing a new child counter value into the parent node's child counter (1006).

Figure 11:
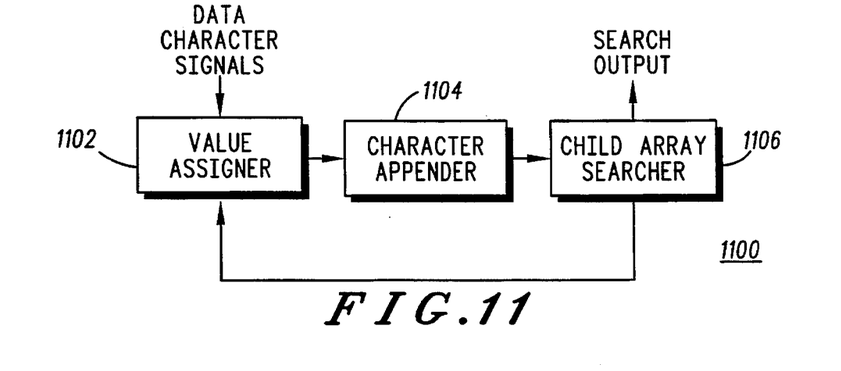
FIG. 11 is a block diagram of a device in accordance with the present invention.

FIG. 11, numeral 1100, is a block diagram of a device in accordance with the present invention. The device maximizes throughput of data character signals in a data compression encoder/decoder wherein a 'string', upon being allocated one character, is represented by a parent node that is allocated a children array, and includes: A) a value assigner, operably coupled to receive data character signals, for assigning a predetermined unique value (i.e., 'character') to a received data character signal (1102), B) a character appender, operably coupled to the value assigner, for appending the 'character' onto a 'string' to create a 'string+character' (1104), C) a child array searcher, operably coupled to the character appender and to the value assigner, for searching the parent node for a match of the 'string+character' by employing a children array indexed by the 'character' (1106) that, where a match is obtained, forms a new 'string' from the 'string+character' and signaling the value assigner to continue the search utilizing a next 'character', and where there is an unsuccessful match, ends the search.

The children array typically has an entry corresponding to each 'character'. The device (1100) is typically utilized in encoders and/or decoders of data communications equipment (DCE) (608, 622). The typical predetermined unique value is an ordinal value.

The device (1100) operates in accordance with the method of the present invention, as described in more detail above.

Figure 12:
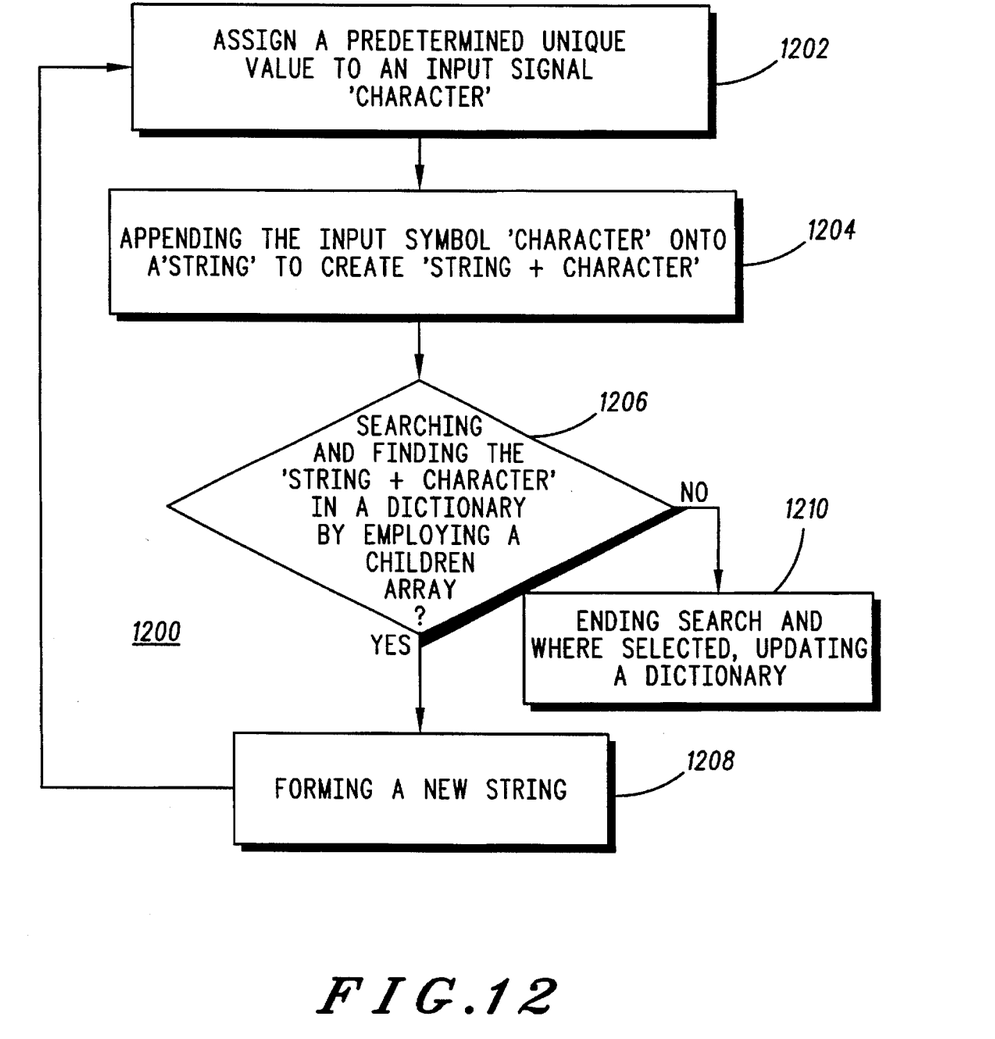
FIG. 12 is a flow chart of an implementation of the method of the present invention.

As shown in FIG. 12, numeral 1200, the method of the present invention may also be described by the following steps: A) assigning a predetermined unique value to an input symbol 'character' (1202), B) appending the input symbol 'character' onto a 'string' to create a 'string+character' (1204), C) searching for the 'string+character' in a dictionary by employing a children array stored along with a node that represents the 'string' (i.e. the parent node), where the children array has an entry corresponding to each of the possible input symbols, (1206), D) where the 'string+character' is in the dictionary (successful match), forming a new string and continuing searching from a node representing the 'string+character' (1208), and E) where there is an unsuccessful match, ending the search (1210). In this method, the further description of the method is as provided above for the method shown in FIG. 7.

Although exemplary embodiments are described above, it will be obvious to those skilled in the art that many alterations and modifications may be made without departing from the invention. Accordingly, it is intended that all such alterations and modifications be included within the spirit and scope of the invention as defined in the appended claims.

I claim:

1. A method for maximizing throughput of data character signals in a data compression encoder/decoder wherein a 'string', upon being allocated one character, is represented by a parent node that is allocated a children array with a child counter, comprising the steps of:

1A) assigning a predetermined unique value (i.e., 'character') to a received data character signal, 1B) appending the 'character' onto a 'string' to create a 'string+character', 1C) searching the parent node for a match of the 'string+character' by employing a children array indexed by the 'character', and one of: 1C1-1C2:

1C1) where a match is obtained, forming a new 'string' from the 'string+character' and recycling to step 1A, 1C2) where there is an unsuccessful match, ending the search.

2. The method of claim 1 wherein the children array has an entry corresponding to each 'character'.

3. The method of claim 1 wherein the predetermined unique value is an ordinal value.

4. The method of claim 1 wherein searching a node comprises searching for the 'string+character' in a dictionary and includes using the predetermined unique value of the 'character' as an offset into the parent node's children array.

5. The method of claim 4 wherein a value stored in the parent node's children array at the offset indicates one of 5A-5B:

5A) a successful match (i.e. 'string+character' is in the dictionary), and 5B) an unsuccessful match.

6. The method of claim 1 wherein, where there is an unsuccessful match, the 'string' represents a longest matched string and the 'character' represents an unmatched character.

7. The method of claim 1 further including a step of updating a dictionary with the 'string+character' following an unsuccessful match.

8. The method of claim 7 wherein updating the dictionary comprises the steps of:

8A) assigning a free node to represent the 'string+character', 8B) adding the free node (i.e. the child node) to the parent node, 8C) recovering a new free node from the dictionary.

9. The method of claim 8 wherein adding the child node to the parent node includes storing a value in the parent node's children array at the offset into the children array corresponding to the predetermined unique value assigned to the 'character', wherein the value indicates that the 'string+character' is in the dictionary.

10. The method of claim 9 wherein the value that indicates that the 'string+character' is in the dictionary is also a pointer to the child node.

11. The method of claim 9 further including a step of adjusting the child counter to indicate that there is one more child represented in the parent node's children array.

12. The method of claim 9 further including a step of storing along with the child node, a pointer to the parent node, for obtaining a pointer to the parent node during a subsequent deletion of the child node.

13. The method of claim 9 further including a step of storing along with the child node, a pointer to the child node's position in the parent node's children array, for obtaining a pointer to the child node's position in the parent node's children array during a subsequent deletion of the child node.

14. The method of claim 9 further including a step of storing along with the child node an index value in correspondence with the child node's offset into the parent node's children array, for obtaining an offset into the parent node's children array during a subsequent deletion of the child node.

15. The method of claim 8 wherein recovering a node from the dictionary comprises the steps of:

15A) proceeding to a node in the dictionary, 15B) determining whether the node is a leaf node, and one of 15B1-15B2:

15B1) where the node is a non-leaf node, continuing the search for a leaf node with the next node, 15B2) where the node is a leaf node, deleting the leaf node from the dictionary to create a new free node.

16. The method of claim 15 wherein determining that the node is a leaf node includes testing that a child counter associated with the node is set to a value signifying an empty children array in the node.

17. The method of claim 15 wherein determining that the node is a leaf node includes testing that each element in the node's children array is set to a value such that searching for a 'string+character' in the dictionary, where 'string' is the string represented by the node and 'character' is the appended 'character' results in an unsuccessful match.

18. The method of claim 15 wherein deleting the leaf node ('string+character') from the dictionary includes storing an unsuccessful match indicator value in the children array of the node that represents 'string' (i.e. the parent node) at the offset into the children array corresponding to the predetermined unique value assigned to the input symbol 'character', such that the unsuccessful match indicator value indicates an unsuccessful match in a subsequent search for the 'string+character'.

19. The method of claim 18 wherein storing an unsuccessful match indicator value in the parent node's children array includes retrieving a pointer to the leaf node's position in the parent node's children array stored along with the leaf node, and writing the unsuccessful match indicator value into the parent node's children array at the position addressed by the pointer to the leaf node's position in the parent node's children array.

20. The method of claim 18 wherein storing an unsuccessful match indicator value in the parent node's children array comprises the steps of 20A-20F:

20A) retrieving a pointer to the parent node stored along with the leaf node, 20B) deriving from the pointer to the parent node a pointer to the parent node's children array, 20C) retrieving an index value associated with the leaf node, 20D) deriving from the index value an offset value into the parent node's children array, 20E) deriving from the pointer to the parent node's children array and the offset value into the parent node's children array a pointer to the leaf node's position in the parent node's children array, 20F) writing the unsuccessful match indicator value into the parent node's children array at the position addressed by the pointer to the leaf node's position in the parent node's children array.

21. The method of claim 18 further including adjusting a child counter associated with the parent node to signify that there is one less child represented in the parent node's children array.

22. The method of claim 21 wherein adjusting the child counter associated with the parent node comprises the steps of:

22A) retrieving a pointer to the parent node stored along with the leaf node, 22B) deriving from the pointer to the parent node a pointer to the parent node's child counter, and 22C) writing a new child counter value into the parent node's child counter.

23. A device for maximizing throughput of data character signals in a data compression encoder/decoder wherein a 'string', upon being allocated one character, is represented by a parent node that is allocated a children array with a child counter, comprising:

23A) a value assigner, operably coupled to receive data character signals, for assigning a predetermined unique value (i.e., 'character') to a received data character signal, 23B) a character appender, operably coupled to the value assigner, for appending the 'character' onto a 'string' to create a 'string+character', 23C) a child array searcher, operably coupled to the character appender and to the value assigner, for searching the parent node for a match of the 'string+character' by employing a children array indexed by the 'character', and one of: 23C1-23C2:

23C1) where a match is obtained, forming a new 'string' from the 'string+character' and signaling the value assigner to continue the search utilizing a next 'character', 23C2) where there is an unsuccessful match, ending the search.

24. The device of claim 23 wherein at least one of:

24A) the children array has an entry corresponding to each 'character', and 24B) the device is in data communications equipment (DCE).

25. The device of claim 23 wherein the predetermined unique value is an ordinal value.

26. The device of claim 23 wherein searching a node comprises searching for the 'string+character' in a dictionary and includes using the predetermined unique value of the 'character' as an offset into the parent node's children array.

27. The device of claim 26 wherein a value stored in the parent node's children array at the offset indicates one of 27A-27B:

27A) a successful match (i.e. 'string+character' is in the dictionary), and 27B) an unsuccessful match.

28. The device of claim 23 wherein, where there is an unsuccessful match, the 'string' represents a longest matched string and the 'character' represents an unmatched character.

29. The device of claim 23 further including the child array searcher's updating the dictionary with the 'string+character' following an unsuccessful match.

30. The device of claim 29 wherein, where the child array searcher's updating the dictionary includes assigning a free node to represent the 'string+character', adding the free node (i.e. the child node) to the parent node, and recovering a new free node from the dictionary.

31. The device of claim 30 wherein adding the child node to the parent node includes the child array searcher's storing a value in the parent node's children array at the offset into the children array corresponding to the predetermined unique value assigned to the 'character', wherein the value indicates that the 'string+character' is in the dictionary.

32. The device of claim 31 wherein the value that indicates that the 'string+character' is in the dictionary is also a pointer to the child node.

33. The device of claim 31 wherein the child array searcher further adjusts the child counter to signify that there is one more child represented in the parent node's children array.

34. The device of claim 31 wherein the child array searcher further stores, in correspondence with the child node, a pointer to the parent node, for obtaining a pointer to the parent node during a subsequent deletion of the child node.

35. The device of claim 31 wherein the child array searcher further stores, in correspondence with the child node, a pointer to the child node's position in the parent node's children array, for obtaining a pointer to the child node's position in the parent node's children array during a subsequent deletion of the child node.

36. The device of claim 31 wherein the child array searcher further stores, in correspondence with the child node, an index value in correspondence with the child node's offset into the parent node's children array, for obtaining an offset into the parent node's children array during a subsequent deletion of the child node.

37. The device of claim 30 wherein the child array searcher further, in recovering a node from the dictionary, proceeds to a node in the dictionary, determines whether the node is a leaf node, and one of 37A-37B:

37A) where the node is a non-leaf node, continues to search for a leaf node with the next node, 37B) where the node is a leaf node, deletes the leaf node from the dictionary to create a new free node.

38. The device of claim 37 wherein the child array searcher, in determining that the node is a leaf node, tests that the child counter associated with the node is set to a value signifying an empty children array in the node.

39. The device of claim 37 wherein the child array searcher, in determining that the node is a leaf node, tests that each element in the node's children array is set to a value such that searching for a 'string+character' in the dictionary, where 'string' is the string represented by the node and 'character' is the appended 'character' and obtains an unsuccessful match.

40. The device of claim 37 wherein the child array searcher, in deleting the leaf node ('string+character') from the dictionary, stores an unsuccessful match indicator value in the children array of the node that represents 'string' (i.e. the parent node) at the offset into the children array corresponding to the predetermined unique value assigned to the input symbol 'character', such that the unsuccessful match indicator value indicates an unsuccessful match in a subsequent search for the 'string+character'.

41. The device of claim 40 wherein the child array searcher, in storing an unsuccessful match indicator value in the parent node's children array, retrieves a pointer to the leaf node's position in the parent node's children array stored along with the leaf node, and writes the unsuccessful match indicator value into the parent node's children array at the position addressed by the pointer to the leaf node's position in the parent node's children array.

42. The device of claim 40 wherein the child array searcher, in storing an unsuccessful match indicator value in the parent node's children array, retrieves a pointer to the parent node stored along with the leaf node, derives from the pointer to the parent node a pointer to the parent node's children array, retrieves an index value associated with the leaf node, derives from the index value an offset value into the parent node's children array, derives from the pointer to the parent node's children array and the offset value into the parent node's children array a pointer to the leaf node's position in the parent node's children array, and writes the unsuccessful match indicator value into the parent node's children array at the position addressed by the pointer to the leaf node's position in the parent node's children array.

43. The device of claim 42 wherein the child array searcher, further adjusts the child counter associated with the parent node to signify that there is one less child represented in the parent node's children array.

44. The device of claim 43 wherein the child array searcher, in adjusting the child counter associated with the parent node, retrieves a pointer to the parent node stored along with the leaf node, derives from the pointer to the parent node a pointer to the parent node's child counter, and writes a new child counter value into the parent node's child counter.

45. A method for maximizing throughput of input symbols in a data compression encoder/decoder of a microprocessor such that microprocessor usage is minimized, comprising the steps of:

45A) assigning a predetermined unique value to an input symbol 'character', 45B) appending the input symbol 'character' onto a 'string' to create a 'string+character', 45C) searching for the 'string+character' in a dictionary by employing a child counter and a children array stored along with a node that represents the 'string' (i.e. the parent node), where the children array has an entry corresponding to each of the possible input symbols, 45D) where the 'string+character' is in the dictionary (successful match), forming a new string and continuing searching from a node representing the 'string+character', 45E) where there is an unsuccessful match, ending the search.

46. The method of claim 45 wherein the predetermined unique value is an ordinal value.

47. The method of claim 45 wherein searching for the 'string+character' in the dictionary comprises the step of using the predetermined unique value assigned to the input symbol 'character' as an offset into the parent node's children array, where the value stored in the parent node's children array at that offset signals whether the search results in a successful match (i.e. 'string+character' is in the dictionary) or an unsuccessful match.

48. The method of claim 45 wherein where there is an unsuccessful match, the 'string' represents a longest matched string and the input symbol 'character' represents an unmatched character.

49. The method of claim 45 further including the step of updating the dictionary with the 'string+character' following an unsuccessful match.

50. The method of claim 49 wherein updating the dictionary comprises the steps of:

50A) assigning a free node to represent the 'string + character', 50B) adding the free node (i.e. the child node) to the parent node, 50C) recovering a new free node from the dictionary.

51. The method of claim 50 wherein adding the child node to the parent node comprises the step of storing a value in the parent node's children array at the offset into the children array corresponding to the predetermined unique value assigned to the input symbol 'character', where the value signals that the 'signal+character' is in the dictionary.

52. The method of claim 51 wherein the value that signals the 'string+character' is in the dictionary is also a pointer to the child node.

53. The method of claim 50 wherein recovering a node from the dictionary comprises the steps of:

57A) proceeding to a node in the dictionary, 57B) determining whether the node is a leaf node, and of:

57B1) where the node is a non-leaf node, continuing the search for a leaf node with the next node, 57B2) where the node is a leaf node, deleting the leaf node from the dictionary to create a new free node.

54. The method of claim 53 wherein determining that the node is a leaf node comprises the step of testing that the child counter associated with the node is set to a value signifying that there are no children represented in the node's children 55. The method of claim 53 wherein determining that the node is a leaf node comprises the step of testing that each element in the node's children array is set to a value such that searching for a 'string+character' in the dictionary, where 'string' is the string represented by the node and 'character' is any input symbol, would result in an unsuccessful match.

56. The method of claim 53 wherein deleting the leaf node from the dictionary, where the leaf node represents a 'string+character', comprises the step of storing a value in the children array of the node that represents 'string' (i.e. the parent node) at the offset into the children array corresponding to the predetermined unique value assigned to the input symbol 'character', such that the value would cause a subsequent search for the 'string+character' to result in an unsuccessful match.

57. The method of claim 56 wherein storing a value in the parent node's children array comprises the steps of:

61A) retrieving a pointer to the leaf node's position in the parent node's children array stored along with the leaf node, 61B) writing the value into the parent node's children array at the position addressed by the pointer to the leaf node's position in the parent node's children array.

58. The method of claim 56 wherein storing a value in the parent node's children array comprises the steps of:

62A) retrieving a pointer to the parent node stored along with the leaf node, 62B) deriving from the pointer to the parent node a pointer to the parent node's children array, 62C) retrieving an index value stored along with the leaf node, 62D) deriving from the index value an offset into the parent node's children array, 62E) deriving from the pointer to the parent node's children array and the offset into the parent node's children array a pointer to the leaf node's position in the parent node's children array, 62F) writing the value into the parent node's children array at the position addressed by the pointer to the leaf node's position in the parent node's children array.

59. (Amended) The method of claim 58 further including the step of adjusting the child counter stored along with the parent node to signify that there is one less child represented in the parent node's children array.

60. The method of claim 59 wherein adjusting the child counter associated with the parent node comprises the steps of:

64A) retrieving a pointer to the parent node stored along with the leaf node, 64B) deriving from the pointer to the parent node a pointer to the parent node's child counter, 64C) writing a new child counter value into the parent node's child counter.

61. The method of claim 49 further including the step of adjusting the child counter stored along with the parent node node to signify that there is one more child represented in the parent node's children array.

62. The method of claim 49 further including the step of storing along with the child node a pointer to the parent node, for obtaining a pointer to the parent node during a subsequent deletion of the child node.

63. The method of claim 49 further including the step of storing along with the child node a pointer to the child node's position in the parent node's children array, for obtaining a pointer to the child node's position in the parent node's children array during a subsequent deletion of the child node.

64. The method of claim 49 further including the step of storing along with the child node an index value, such as the input symbol 'character' or the predetermined unique value assigned to the input symbol 'character', from which the child node's offset into the parent node's children array can be derived, for obtaining an offset into the parent node's children array during a subsequent deletion of the child node.

* * * * *